US011404324B2

(12) United States Patent
Chiang et al.

(10) Patent No.: US 11,404,324 B2
(45) Date of Patent: Aug. 2, 2022

(54) FIN ISOLATION STRUCTURES OF SEMICONDUCTOR DEVICES

(71) Applicant: Taiwan Semiconductor Manufacturing Co., Ltd., Hsinchu (TW)

(72) Inventors: Kuo-Cheng Chiang, Hsinchu County (TW); Chih-Hao Wang, Hsinchu County (TW); Kuan-Lun Cheng, Hsin-Chu (TW); Yen-Ming Chen, Hsin-Chu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 31 days.

(21) Appl. No.: 17/001,211

(22) Filed: Aug. 24, 2020

(65) Prior Publication Data

US 2020/0388542 A1  Dec. 10, 2020

Related U.S. Application Data

(60) Continuation of application No. 16/204,892, filed on Nov. 29, 2018, now Pat. No. 10,755,983, which is a division of application No. 15/718,752, filed on Sep. 28, 2017, now Pat. No. 10,714,394.

(51) Int. Cl.
*H01L 29/78* (2006.01)
*H01L 21/8234* (2006.01)
*H01L 27/088* (2006.01)
*H01L 29/66* (2006.01)

(Continued)

(52) U.S. Cl.
CPC ......... *H01L 21/823481* (2013.01); *H01L 21/02236* (2013.01); *H01L 21/76202* (2013.01); *H01L 27/0886* (2013.01); *H01L 29/6681* (2013.01); *H01L 21/823431* (2013.01)

(58) Field of Classification Search
CPC ............ H01L 29/785; H01L 29/66795; H01L 21/823431
See application file for complete search history.

(56) References Cited

U.S. PATENT DOCUMENTS 9,287,262 B2   3/2016   Chen et al.
9,418,897 B1   8/2016   Ching et al.
10,062,690 B2  8/2018   Liu et al.
(Continued)

FOREIGN PATENT DOCUMENTS

CN    203760482 U    8/2014
CN    104813476 A    7/2015

*Primary Examiner* — Mark V Prenty
(74) *Attorney, Agent, or Firm* — Sterne, Kessler, Goldstein & Fox P.L.L.C.

(57) ABSTRACT

A method of forming a fin field effect transistor (finFET) on a substrate includes forming a fin structure on the substrate and forming a shallow trench isolation (STI) region on the substrate. First and second fin portions of the fin structure extend above a top surface of the STI region. The method further includes oxidizing the first fin portion to convert a first material of the first fin portion to a second material. The second material is different from the first material of the first fin portion and a material of the second fin portion. The method further includes forming an oxide layer on the oxidized first fin portion and the second fin portion and forming first and second polysilicon structures on the oxide layer.

20 Claims, 11 Drawing Sheets

(51) Int. Cl.
*H01L 21/02* (2006.01)
*H01L 21/762* (2006.01)

(56) References Cited

U.S. PATENT DOCUMENTS

| | | |
|---|---|---|
| 10,096,683 B2 | 10/2018 | Then et al. |
| 10,134,760 B2 | 11/2018 | Cheng et al. |
| 10,170,546 B2 | 1/2019 | Loubet et al. |
| 10,170,596 B2 | 1/2019 | Cheng et al. |
| 10,755,983 B2 * | 8/2020 | Chiang ............... H01L 29/6681 |
| 2015/0060959 A1 | 3/2015 | Lin et al. |
| 2015/0333156 A1 | 11/2015 | Cheng et al. |
| 2016/0197005 A1 | 7/2016 | Tsao et al. |
| 2016/0315147 A1 | 10/2016 | Leobandung et al. |
| 2016/0365345 A1 | 12/2016 | Ching et al. |
| 2017/0005002 A1 | 1/2017 | Ching et al. |
| 2017/0141112 A1 | 5/2017 | Ching et al. |

* cited by examiner

FIN ISOLATION STRUCTURES OF SEMICONDUCTOR DEVICES

This application is a continuation application of U.S. patent application Ser. No. 16/204,892, titled "Fin Isolation Structures of Semiconductor Devices," filed on Nov. 29, 2018, which is a divisional application of U.S. patent application Ser. No. 15/718,752, titled "Fin Isolation Structures of Semiconductor Devices," filed on Sep. 28, 2017 (U.S. Pat. No. 10,714,394), all of which are incorporated herein by reference in their entireties.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

Illustrative embodiments will now be described with reference to the accompanying drawings. In the drawings, like reference numerals generally indicate identical, functionally similar, and/or structurally similar elements.

DETAILED DESCRIPTION

Figure 1:
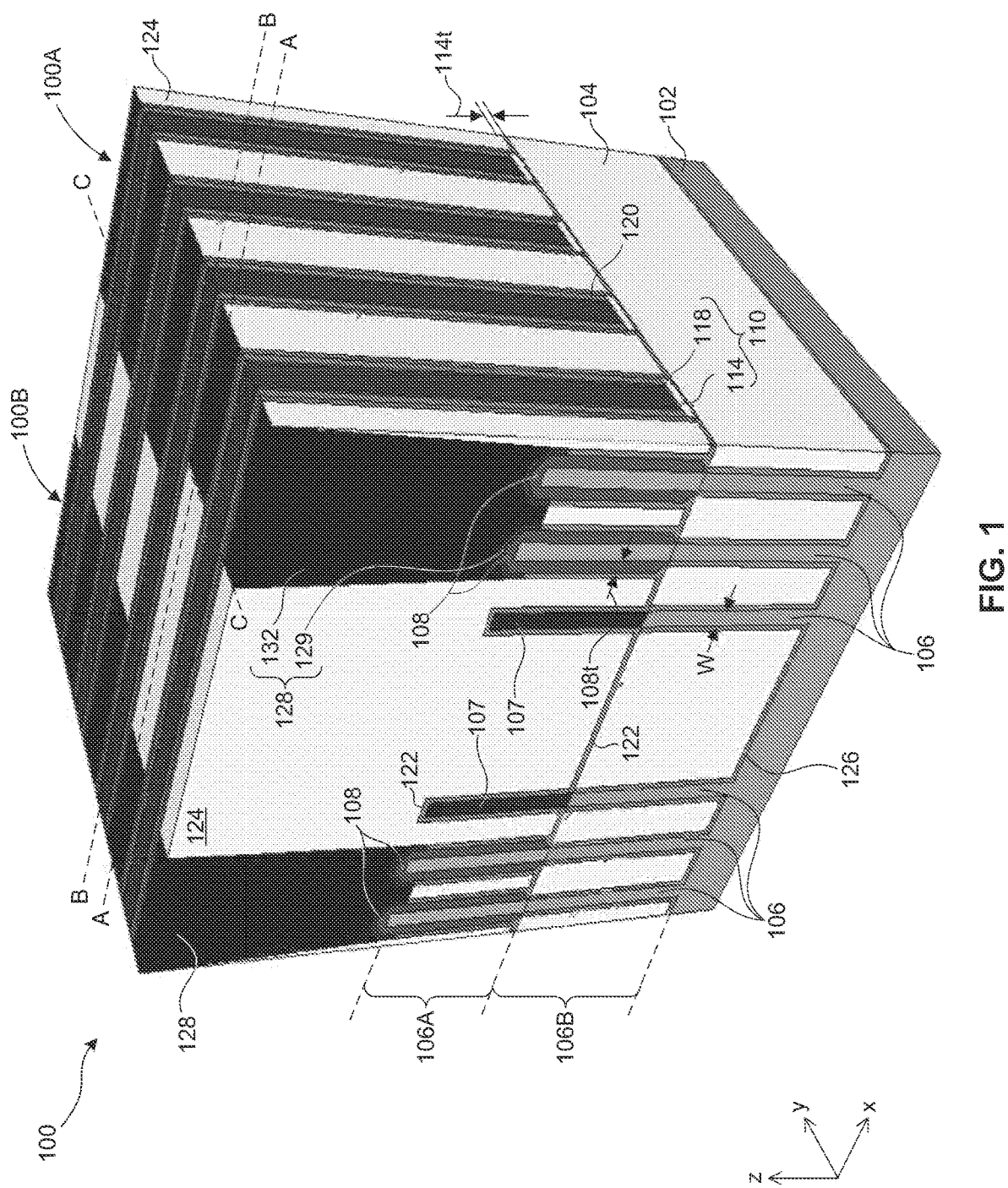
FIG. 1 is an isometric view of fin field effect transistors (finFETs), in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fins of fin field effect transistors (finFETs) may be patterned by any suitable method. For example, the fins may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

As used herein, the term "selectivity" refers to the ratio of the etch rates of two materials under the same etching conditions.

As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "substantially" indicates the value of a given quantity varies by ±5% of the value.

As used herein, the term "substrate" describes a material onto which subsequent material layers are added. The substrate itself may be patterned. Materials added on top of the substrate may be patterned or may remain unpatterned. Furthermore, the substrate may be a wide array of semiconductor materials such as, for example, silicon, germanium, gallium arsenide, indium phosphide, etc. Alternatively, the substrate may be made from an electrically non-conductive material such as, for example, a glass or a sapphire wafer.

As used herein, the term "high-k" refers to a high dielectric constant. In the field of semiconductor device structures and manufacturing processes, high-k refers to a dielectric constant that is greater than the dielectric constant of $SiO_2$ (e.g., greater than 3.9).

As used herein, the term "low-k" refers to a small dielectric constant. In the field of semiconductor device structures and manufacturing processes, low-k refers to a dielectric constant that is less than the dielectric constant of $SiO_2$ (e.g., less than 3.9).

As used herein, the term "p-type" defines a structure, layer, and/or region as being doped with p-type dopants, such as, for example, boron.

As used herein, the term "n-type" defines a structure, layer, and/or region as being doped with n-type dopants, such as, for example, phosphorus.

As used herein, the term "vertical" means nominally perpendicular to the surface of a substrate.

As used herein, the term "critical dimension" refers to the smallest feature size (e.g., line width) of a finFET and/or an element of an integrated circuit.

This disclosure provides example methods for fabricating fin isolation structures of finFETs with fewer process steps than other methods used in forming fin isolation structures. The example methods may form the fin isolation structures without substantially degrading the structural integrity of fin structures adjacent to and/or in contact with the fin isolation structures. In some embodiments, the example methods may form the fin isolation structures without substantially reducing strain in the fin structures and without adversely affecting the high mobility channel performance of the finFETs.

FIG. 1 is an isometric view of a device 100 having first and second finFETs 100A and 100B, according to some embodiments. The discussion below of elements of finFET 100A applies to elements of finFET 100B with the same annotations unless mentioned otherwise. It will be recognized that the view of device 100 is shown for illustration purposes and may not be drawn to scale.

In some embodiments, finFETs 100A and 100B may be formed on a substrate 102. In some embodiments, finFETs 100A and 100B may each include shallow trench isolation (STI) regions 104, fin structures 106, fin isolation structures 107, epitaxial regions 108, gate structures 110, spacers 120, etch stop layer (ESL) 122, and interlayer dielectric (ILD) layer 124. Even though FIG. 1 shows finFETs 100A and 100B each having one fin isolation structure 107, finFETs 100A and 100B may have one or more fin isolation structures similar to fin isolation structures 107. In some embodiments, finFETs 100A and 100B may be either n-type finFETs or p-type finFETs. In some embodiments, finFETs 100A and 100B may be n- and p-type finFETs, respectively, or p- and n-type finFETs, respectively.

Substrate 102 may be a physical material on which finFET 100 are formed. Substrate 102 may be a semiconductor material such as, but not limited to, silicon. In some embodiments, substrate 102 includes a crystalline silicon substrate (e.g., wafer). In some embodiments, substrate 102 includes (i) an elementary semiconductor, such as germanium; (ii) a compound semiconductor including silicon carbide, gallium arsenide, gallium phosphide, indium phosphide, indium arsenide, and/or indium antimonide; (iii) an alloy semiconductor including silicon germanium carbide, silicon germanium, gallium arsenic phosphide, gallium indium phosphide, gallium indium arsenide, gallium indium arsenic phosphide, aluminum indium arsenide, and/or aluminum gallium arsenide; or (iv) a combination thereof. Further, substrate 102 may be doped depending on design requirements (e.g., p-type substrate or n-type substrate). In some embodiments, substrate 102 may be doped with p-type dopants (e.g., boron, indium, aluminum, or gallium) or n-type dopants (e.g., phosphorus or arsenic).

STI regions 104 may provide electrical isolation to finFETs 100A and 100B from each other and from neighboring active and passive elements (not illustrated herein) integrated with or deposited onto substrate 102. STI regions 104 may be made of a dielectric material. In some embodiments, STI regions 104 may include silicon oxide, silicon nitride, silicon oxynitride, fluorine-doped silicate glass (FSG), a low-k dielectric material, and/or other suitable insulating material. In some embodiments, STI regions 104 may include a multi-layered structure.

Fin structures 106 may traverse along a Y-axis and through gate structures 110. Portions of fin structures 106 extending above STI regions 104 may be wrapped around by gate structures 110 (not shown in FIG. 1; shown in FIGS. 2B and 3B). In some embodiments, fin structures 106 may each include material similar to substrate 102. In some embodiments, fin portions 106A and 106B of each fin structures 106 may include material similar to or different from each other. In some embodiments, fin portions 106A and 106B of p-type finFETs 100A and 100B may include material different from each other. In some embodiments, fin portions 106A and 106B of n-type finFETs 100A and 100B may include material similar to each other. In some embodiments, fin portions 106A may include an alloy semiconductor including silicon germanium carbide, silicon germanium, gallium arsenic phosphide, gallium indium phosphide, gallium indium arsenide, gallium indium arsenic phosphide, aluminum indium arsenide, and/or aluminum gallium arsenide and fin portions 106B may include an elementary semiconductor, such as silicon or germanium. Fin portions 106A and 106B may be positioned above and below top surfaces of STI regions 104, respectively. In some embodiments, top surfaces of fin portions 106A may be substantially coplanar with top surfaces of STI regions. In some embodiments, fin portions 106A and 106B may each have a height ranging from about 50 nm to about 60 nm.

In some embodiments, fin structures 106 may each be formed from a photolithographic patterning and an etching of respective substrate 102. Fin structures 106 may have widths W in a range from about 5 nm to about 10 nm, according to some embodiments. Other widths and materials for fin structures 106 are within the scope and spirit of this disclosure.

In some embodiments, epitaxial regions 108 may be grown on fin portions of fin structures 106 that extend above STI regions 104 and are not underlying gate structures 110. In some embodiments, epitaxial regions 108 may be grown on areas of fin portions 106A that are not underlying gate structures 110. Epitaxial regions 108 may include an epitaxially-grown semiconductor material. In some embodiments, the epitaxially grown semiconductor material is the same material as the material of substrate 102. In some embodiments, the epitaxially-grown semiconductor material includes a different material from the material of substrate 102. The epitaxially-grown semiconductor material may include: (i) a semiconductor material such as, for example, germanium or silicon; (ii) a compound semiconductor material such as, for example, gallium arsenide and/or aluminum gallium arsenide; or (iii) a semiconductor alloy such as, for example, silicon germanium and/or gallium arsenide phosphide. In some embodiments, epitaxial regions 108 may each have a thickness $108t$ in a range from about 5 nm to about 15 nm around respective portions of fin structures 106 above STI regions 104.

In some embodiments, epitaxial regions 108 may be grown by (i) chemical vapor deposition (CVD) such as, for example, by low pressure CVD (LPCVD), atomic layer CVD (ALCVD), ultrahigh vacuum CVD (UHVCVD), reduced pressure CVD (RPCVD), or any suitable CVD; (ii) molecular beam epitaxy (MBE) processes; (iii) any suitable epitaxial process; or (iv) a combination thereof. In some embodiments, epitaxial regions 108 may be grown by an epitaxial deposition/partial etch process, which repeats the epitaxial deposition/partial etch process at least once. Such repeated deposition/partial etch process is also called a "cyclic deposition-etch (CDE) process." In some embodiments, epitaxial regions 108 may be grown by selective epitaxial growth (SEG), where an etching gas is added to promote the selective growth of semiconductor material on the exposed surfaces of fin structures 108, but not on insulating material (e.g., dielectric material of STI regions 104).

In some embodiments, epitaxial regions 108 may be p-type or n-type. In some embodiments, epitaxial regions 108 of finFETs 100A and 100B may be of opposite doping type with respect to each other. In some embodiments, p-type epitaxial regions 108 may include SiGe and may be in-situ doped during an epitaxial growth process using p-type dopants such as, for example, boron, indium, or gallium. For p-type in-situ doping, p-type doping precursors such as, but not limited to, diborane ($B_2H_6$), boron trifluoride ($BF_3$), and/or other p-type doping precursors can be used.

In some embodiments, each of p-type epitaxial regions 108 may have a plurality of sub-regions (not shown) that may include SiGe and may differ from each other based on, for example, doping concentration, epitaxial growth process conditions, and/or relative concentration of Ge with respect to Si. In some embodiments, each of the sub-regions may have thicknesses similar to or different from each other and thicknesses may range from about 0.5 nm to about 5 nm. In some embodiments, the atomic percent Ge in sub-regions closest to a top surface of fin structures 106 may be smaller than the atomic percent Ge in sub-regions farthest from the top surface of fin structures 106. In some embodiments, the sub-regions closest to the top surface of fin structures 106 may include Ge in a range from about 15 atomic percent to about 35 atomic percent, while the sub-regions farthest from the top surface of fin structures 106 may include Ge in a range from about 25 atomic percent to about 50 atomic percent with any remaining atomic percent being Si in the sub-regions.

The plurality of sub-regions of p-type epitaxial regions 108 may be epitaxially grown under a pressure of about 10 Torr to about 300 Torr and at a temperature of about 500° C. to about 700° C. using reaction gases such as HCl as an etching agent, $GeH_4$ as Ge precursor, dichlorosilane (DCS) and/or $SiH_4$ as Si precursor, $B_2H_6$ as B dopant precursor, $H_2$, and/or $N_2$. To achieve different concentration of Ge in the plurality of sub-regions, the ratio of a flow rate of Ge to Si precursors may be varied during their respective growth process, according to some embodiments. For example, a Ge to Si precursor flow rate ratio in a range from about 9 to about 25 may be used during the epitaxial growth of the sub-regions closest to the top surface of fin structures 106, while a Ge to Si precursor flow rate ratio less than about 6 may be used during the epitaxial growth of the sub-regions farthest from the top surface of fin structures 106.

The plurality of sub-regions of p-type epitaxial regions 108 may have varying p-type dopant concentration with respect to each other, according to some embodiments. For example, the sub-regions closest to the top surface of fin structures 106 may be undoped or may have a dopant concentration lower (e.g., dopant concentration less than about $8\times10^{20}$ atoms/$cm^3$) than the dopant concentrations (e.g., dopant concentration in a range from about $1\times10^{20}$ to about $3\times10^{22}$ atoms/$cm^3$) of the sub-regions farthest from the top surface of fin structures 106.

In some embodiments, n-type epitaxial regions 108 may include Si and may be in-situ doped during an epitaxial growth process using n-type dopants such as, for example, phosphorus or arsenic. For n-type in-situ doping, n-type doping precursors such as, but not limited to, phosphine ($PH_3$), arsine ($AsH_3$), and/or other n-type doping precursor can be used. In some embodiments, each of n-type epitaxial regions 108 may have a plurality of n-type sub-regions. Except for the type of dopants, the plurality of n-type sub-regions may be similar to the plurality of p-type sub-regions, in thickness, relative Ge concentration with respect to Si, dopant concentration, and/or epitaxial growth process conditions.

Other materials, thicknesses, Ge concentrations, and dopant concentrations for the plurality of n-type and/or p-type sub-regions are within the scope and spirit of this disclosure.

Fin structures 106 are current-carrying structures for respective finFETs 100A and 100B. Epitaxial regions 108 along with the portions of fin structures 106 covered by respective epitaxial regions 106 are configured to function as source/drain (S/D) regions of respective finFETs 100A and 100B. Channel regions (not shown) of finFETs 100A and 100B may be formed in portions of their respective fin structures 106 underlying gate structures 110.

In some embodiments, fin isolation regions 107 may be electrically insulated portions of fin structures 106. Fin isolation structures 107 may be also referred as "electrically inactive regions of fin structures 106 or finFETs 100A and/or 100B." In some embodiments, fin isolation structures 107 may be used to reduce active regions of finFETs 100A and 100B to reduce power consumption. Fin isolation structures 107 may be positioned between and/or in contact with two electrically active portions of fin structures 106 (not shown in FIG. 1; shown in FIG. 11). In some embodiments, portions of fin structures 106 that are electrically conductive and/or function as S/D regions may be referred as "electrically active portions of fin structures 106." In some embodiments, fin isolation structures 107 may have horizontal and vertical dimensions (e.g., width and height) that are substantially equal to that of fin portions 106A. In some embodiments, fin isolation structures 107 may have a vertical dimension that is smaller than vertical dimensions of fin portions 106A (discussed further with reference to FIGS. 3A-3C). In some embodiments, fin isolation structures may include oxide material such as, for example, silicon oxide or silicon germanium oxide. In some embodiments, fin isolation structures 107 may include doped oxide material such as, for example, doped $SiO_2$ having Ge dopants.

One or more portions of fin structures 106 that extend above STI regions may be selectively modified (e.g., converted and/or oxidized) to an electrically insulating structure to form fin isolation structures 107. Such selective conversion of the one or more portions of fin structures 106 may be done by using photolithographic patterning to expose the one or more portions and performing an oxidation process on the exposed portions. In order to form fin isolation structures 107, the one or more portions of fin structures 106 are not removed by an etching process (also referred as a "fin cutting process") and replaced with a deposited insulating material as done in other methods of forming fin isolation structures. This removal process performed in other methods reduce strain in fin structures 106 when finFETs 100A and 100B may be used as p-type finFETs having strained fin structures 106. Such reduction in strain may adversely affect high mobility channel performance of finFETs. Thus, the example methods of forming fin isolation structures 107 in the present disclosure, without the use of fin cutting process, may prevent the reduction of strain in fin structures 106, and consequently, improve the performance of finFETs 100A and 100B. The formation of fin isolation structures 107 is described in further detail with reference to FIGS. 5-11.

Each of gate structures 110 may include a dielectric layer (not shown) and a gate electrode 118. Additionally, in some embodiments, each of gate structures 110 may include an oxide layer 114 and may form a part of gate dielectric layers of gate structures 110 when finFETs 100A and 100B are used as input/output (IO) devices in peripheral circuits (e.g., IO circuits) formed in peripheral regions (also may be referred as "IO regions" or "high voltage regions") of an integrated circuit (IC). The IO devices may be configured to handle the input/output voltages/currents of the IC and to tolerate a greater amount of voltage or current swing than non-IO devices.

In some embodiments, oxide layer 114 may be absent when finFETs 100A and 100B are used as non-input/output (non-IO) devices in core circuits (also may be referred as "logic circuits" or "memory circuits") formed in core regions (also may be referred as "logic regions" or "memory regions") of an IC. In some embodiments, the non-IO devices may be core devices, logic devices, and/or memory devices that are not configured to handle the input/output voltages/currents directly. In some embodiments, the non-IO devices may include logic gates such as, for example, NAND, NOR, INVERTER, or a combination thereof. In some embodiments, the non-IO devices may include a memory device such as, for example, a static random-access memory (SRAM) device.

Referring back to FIG. 1, the dielectric layer may be adjacent to and in contact with gate electrode 118. The dielectric layer may have a thickness in a range of about 1 nm to about 5 nm. The dielectric layer may include silicon oxide and may be formed by CVD, atomic layer deposition (ALD), physical vapor deposition (PVD), e-beam evaporation, or other suitable process. In some embodiments, dielectric layer may include (i) a layer of silicon oxide, silicon nitride, and/or silicon oxynitride, (ii) a high-k dielectric material such as, for example, hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), zirconium silicate ($ZrSiO_2$), (iii) a high-k dielectric material having oxides of lithium (Li), beryllium (Be), magnesium (Mg), calcium (Ca), strontium (Sr), scandium (Sc), yttrium (Y), zirconium (Zr), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu), or (iv) a combination thereof. High-k dielectric layers may be formed by ALD and/or other suitable methods. In some embodiments, dielectric layer may include a single layer or a stack of insulating material layers. Other materials and formation methods for dielectric layer are within the scope and spirit of this disclosure.

In some embodiments, oxide layer 114 may be in contact with spacers 120 and may extend along a Y-axis in a manner such that a portion of oxide layer may be under and in contact with dielectric layer and another portion of oxide layer 114 may be under and in contact with spacers 120A as shown in FIG. 1. Oxide layer 114 may include a suitable oxide material, such as, for example, silicon oxide and may be deposited using a suitable deposition process, such as, for example, CVD or ALD. In some embodiments, oxide layer 114 may have a thickness $114t$ ranging from about 1 nm to about 3 nm. It will be recognized that other oxide materials, formation methods, and thicknesses for protective oxide layer 114 are within the scope and spirit of this disclosure.

Gate electrode 118 may include a gate work function metal layer (not shown) and a gate metal fill layer (not shown). In some embodiments, the gate work function metal layer is disposed on dielectric layer 116. The gate work function metal layer may include a single metal layer or a stack of metal layers. The stack of metal layers may include metals having work functions similar to or different from each other. In some embodiments, the gate work function metal layer may include, for example, aluminum (Al), copper (Cu), tungsten (W), titanium (Ti), tantalum (Ta), titanium nitride (TiN), tantalum nitride (TaN), nickel silicide (NiSi), cobalt silicide (CoSi), silver (Ag), tantalum carbide (TaC), tantalum silicon nitride (TaSiN), tantalum carbon nitride (TaCN), titanium aluminum (TiAl), titanium aluminum nitride (TiAlN), tungsten nitride (WN), metal alloys, and/or combinations thereof. The gate work function metal layer may be formed using a suitable process such as ALD, CVD, PVD, plating, or combinations thereof. In some embodiments, the gate work function metal layer has a thickness in a range from about 2 nm to about 15 nm. Based on the disclosure herein, it will be recognized that other materials, formation methods and thicknesses for the gate work function metal layer are within the scope and spirit of this disclosure.

The gate metal fill layer may include a single metal layer or a stack of metal layers. The stack of metal layers may include metals different from each other. In some embodiments, the gate metal fill layer may include a suitable conductive material such as, for example, Ti, silver (Ag), Al, titanium aluminum nitride (TiAlN), tantalum carbide (TaC), tantalum carbo-nitride (TaCN), tantalum silicon nitride (TaSiN), manganese (Mn), Zr, titanium nitride (TiN), tantalum nitride (TaN), ruthenium (Ru), molybdenum (Mo), tungsten nitride (WN), copper (Cu), tungsten (W), cobalt (Co), nickel (Ni), titanium carbide (TiC), titanium aluminum carbide (TiAlC), tantalum aluminum carbide (TaAlC), metal alloys, and/or combinations thereof. The gate metal fill layer may be formed by ALD, PVD, CVD, or other suitable deposition process. Based on the disclosure herein, it will be recognized that other materials and formation methods for the gate metal fill layer are within the scope and spirit of this disclosure.

Spacers 120 may form sidewalls of gate structures 110 and are in contact with oxide layer 114 and in contact with dielectric layer, according to some embodiments. Spacers 120 may include insulating material such as, for example, silicon oxide, silicon nitride, a low-k material, or a combination thereof. Spacers 120 may have a low-k material with a dielectric constant less than 3.9 (e.g., less than 3.5, 3.0, or 2.8). In some embodiments, each of spacers 120 may have a thickness ranging from about 7 nm to about 10 nm. Other materials and thicknesses for spacers 120 are within the scope and spirit of this disclosure.

ESL 122 may be configured to protect gate structures 110 and/or portions of epitaxial regions 108 that are not in contact with metal silicide layers 129 and/or source/drain (S/D) contact structures 128. This protection may be provided, for example, during formation of ILD layer 124 and/or S/D contact structures 128. ESL 122 may be disposed on sides of spacers 120. In some embodiments, ESL 122 may include, for example, silicon nitride ($SiN_x$), silicon oxide ($SiO_x$), silicon oxynitride (SiON), silicon carbide (SiC), silicon carbo-nitride (SiCN), boron nitride (BN), silicon boron nitride (SiBN), silicon carbon boron nitride (SiCBN), or a combination thereof. In some embodiments, ESL 122 may include silicon nitride or silicon oxide formed by low pressure chemical vapor deposition (LPCVD), plasma enhanced chemical vapor deposition (PECVD), chemical vapor deposition (CVD), or silicon oxide formed by a high-aspect-ratio process (HARP). In some embodiments, ESL 122 may have a thickness in a range from about 3 nm to 10 nm or from about 10 nm to about 30 nm. Other materials, formation methods, and thicknesses for ESL 122 are within the scope and spirit of this disclosure.

ILD layer 124 may be disposed on ESL 122 and may include a dielectric material deposited using a deposition method suitable for flowable dielectric materials (e.g., flowable silicon oxide, flowable silicon nitride, flowable silicon oxynitride, flowable silicon carbide, or flowable silicon oxycarbide). For example, flowable silicon oxide may be deposited using flowable CVD (FCVD). In some embodiments, the dielectric material is silicon oxide. In some embodiments, ILD layer 124 may have a thickness in a range from about 50 nm to about 200 nm. Other materials, thicknesses, and formation methods for ILD layer 124 are within the scope and spirit of this disclosure.

S/D contact structures 128 may be configured to electrically connect epitaxial regions 108 to other elements of finFETs 100A and 100B and/or of the integrated circuit. S/D contact structures 128 may be formed within ILD layer 124. Each of S/D contact structures 128 may include a metal silicide layer 129 and a conductive region 132. The metal silicide layers 129 may be at interface between top surfaces of epitaxial regions 108 and conductive regions 132. In some embodiments, there may be conductive liners (not shown) between metal silicide layers 129 and conductive regions 132. The conductive liners may be configured as diffusion barriers to prevent diffusion of unwanted atoms and/or ions into epitaxial regions 108 during formation of conductive regions 132. In some embodiments, the conductive liners may include a single layer or a stack of conductive materials such as, for example, TiN, Ti, Ni, TaN, Ta, or a combination thereof. In some embodiments, the conductive liners may act as an adhesion-promoting-layer, a glue-layer, a primer-layer, a protective-layer, and/or a nucleation-layer. The conductive liners may have a thickness in a range from about 1 nm to about 2 nm, according to some embodiments.

In some embodiments, metal silicide layers 129 may include metal silicides and may provide a low resistance interface between respective conductive regions 132 and corresponding epitaxial regions 108. Examples of metal used for forming the metal silicides are Co, Ti, or Ni.

In some embodiments, conductive regions 132 may include conductive materials such as, for example, W, Al, or Co. In some embodiments, conductive regions 132 may each have an average horizontal dimension (e.g., width) in a range from about 15 nm to about 25 nm and may each have an average vertical dimension (e.g., height) in a range from about 400 nm to about 600 nm. Other materials and dimensions for conductive liners, metal silicide layers 129, and conducive regions 132 are within the scope and spirit of this disclosure.

In some embodiments, finFETs 100A and 100B may further include an insulating liner 126 deposited along the sidewalls of fin portions 106B and a top surface of substrate 102. Insulating liner 126 may be formed to protect fin structures 106 from oxidation during formation of STI regions 104. The formation and function of insulating liner 126 is further discussed with reference to FIGS. 6-7. In some embodiments, insulating liner 126 may include nitride (e.g., SiN) or oxide (e.g., $SiO_2$) materials.

FIG. 1 shows four gate structures 110. However, it will be recognized that finFETs 100A and 100B may have one or more gate structures similar and/or parallel to gate structures 110. In addition, finFETs 100A and 100B may be incorporated into an integrated circuit through the use of other structural components such as gate contact structures, conductive vias, conductive lines, dielectric layers, passivation layers, etc., that are omitted for the sake of simplicity. It will be recognized that cross-sectional shapes of STI regions 104, fin structures 106, fin isolation structures 107, epitaxial regions 108, gate structures 110, spacers 120, ESL 124, ILD layer 126, and S/D contact structures 128 are illustrative and are not intended to be limiting.

Figure 2A:
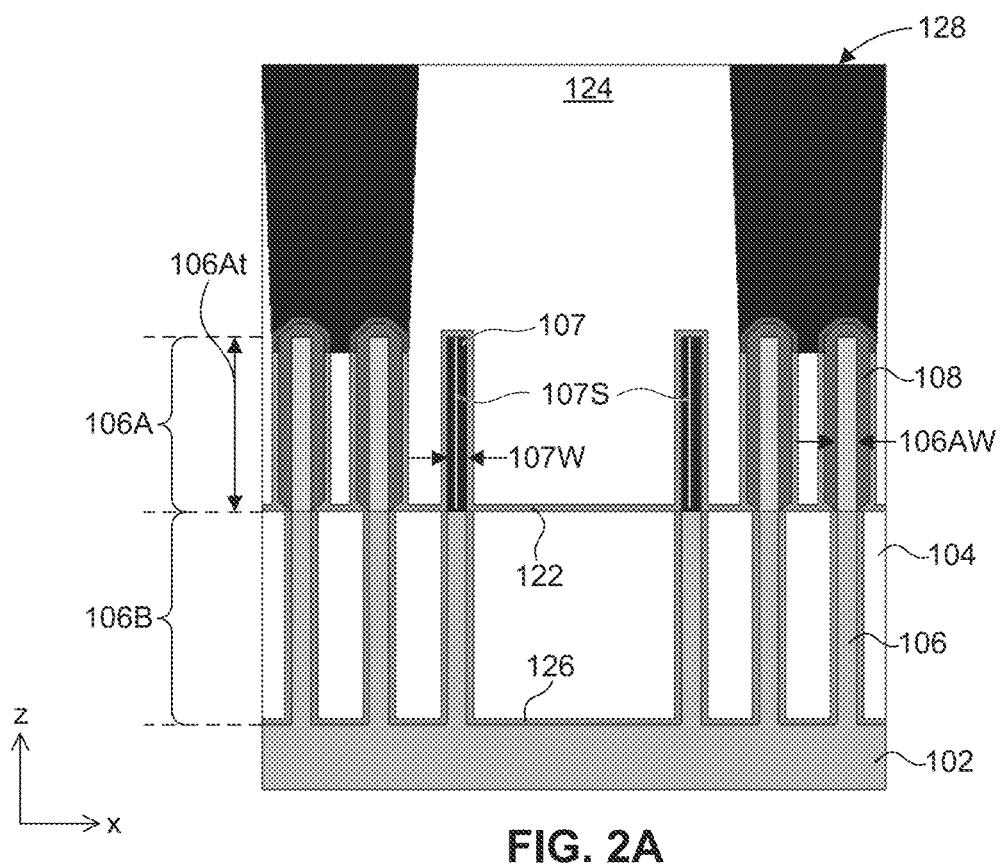
FIGS. 2A-2C are cross-sectional views of finFETs, in accordance with some embodiments.
Figure 2B:
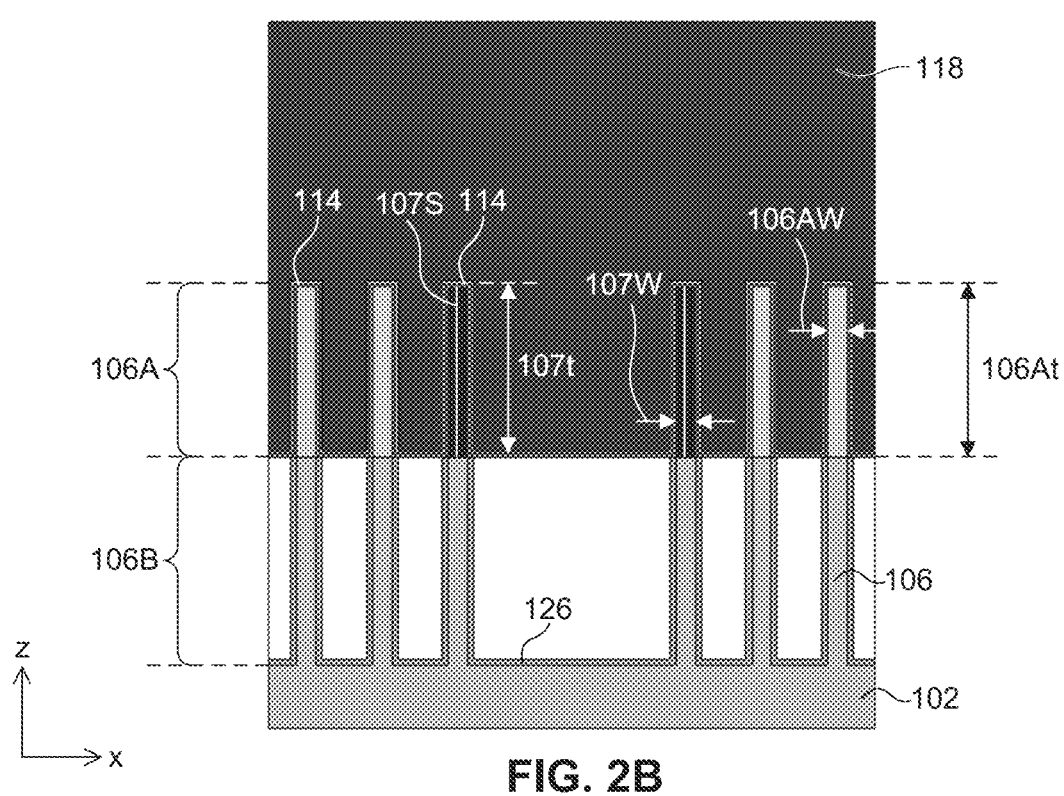
Figure 2C:
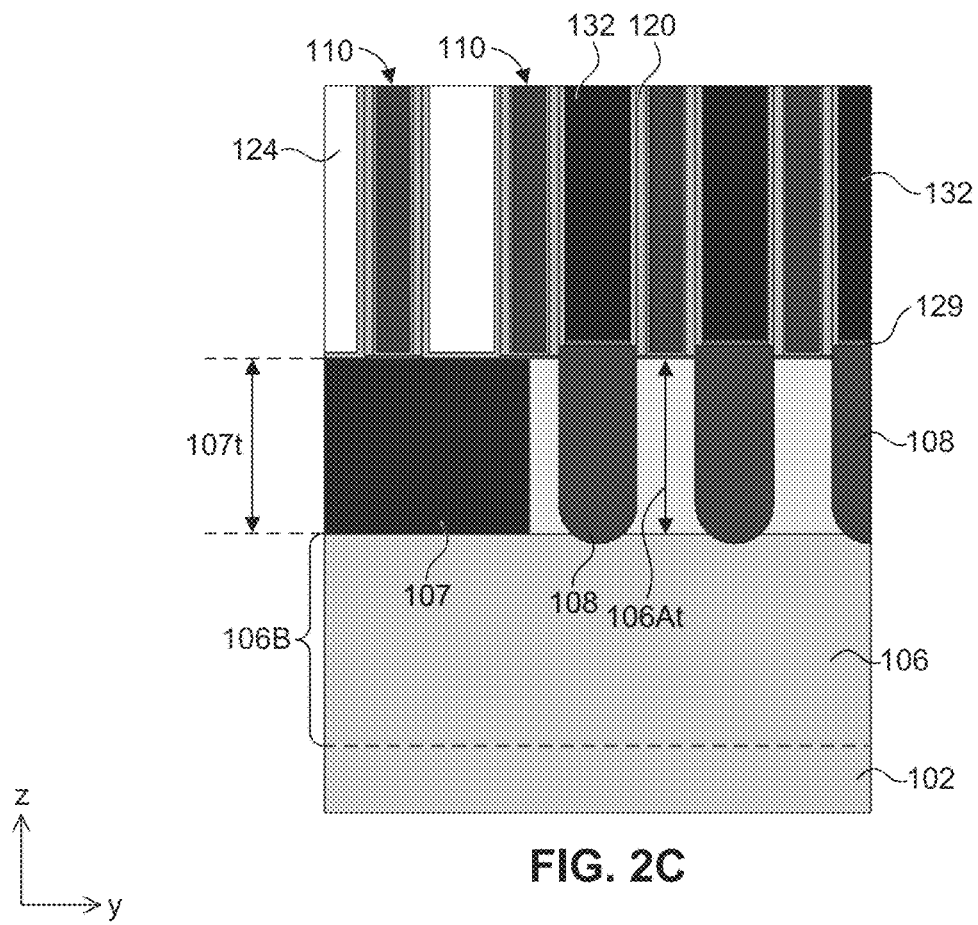

FinFETs 100A and 100B are further described with reference to FIGS. 2A-2C. Elements in FIGS. 2A-2C with the same annotations as elements in FIG. 1 are described above. FIGS. 2A-2C are cross-sectional views along lines A-A, B-B, and C-C of device 100 of FIG. 1, respectively, according to some embodiments. It will be recognized that the views of finFETs 100A and 100B in FIGS. 2A-2C are shown for illustration purposes and may not be drawn to scale. It will be recognized that cross-sectional shapes of STI regions 104, fin structures 106, fin isolation structures 107, epitaxial regions 108, gate structures 110, spacers 120, ESL 122, ILD layer 124, and S/D contact structures 128 shown in FIGS. 2A-2C are illustrative and are not intended to be limiting.

As shown in FIGS. 2A-2B, some portions of fin isolation structures 107 may be wrapped around with ESL 122 and ILD layer 124 and some portions may be wrapped around with oxide layer 114 and gate electrode 118, respectively. In some embodiments, cross-sections of fin isolation structure 107 may each have a vertical dimension 107t that is substantially equal to vertical dimensions 106At of fin portions 106A. In some embodiments, dimension 107t may range from about 50 nm to about 60 nm. In some embodiments, the cross-sections of fin isolation structures 107 may each have a horizontal dimension 107w that is substantially equal to horizontal dimensions 106Aw of fin portions 106A. In some embodiments, dimension 107w may range from about 5 nm to about 10 nm.

In some embodiments, fin isolation structure 107 may have an interface 107s. Interface 107s may be formed as a result of oxidation process that may be used to form fin isolation structure 107. In some embodiments, interface 107s may have high concentration of dopants (e.g., Ge dopants), which may be as a result of the oxidation process. The formation of interface 107s is further discussed below with reference to FIG. 11.

FIG. 2C shows a cross-sectional view of device 100 along line C-C running through one of fin structures 106 having a fin isolation structure 107. It will be understood that based on design and function of device 100, one or more of fin structures 106 may each have one or more fin isolation structures 107. As shown in FIG. 2C, fin isolation structure 107 may be adjacent to fin portion 106A along a Y-axis and may be on top of fin portion 106B. Some portions of fin isolation structure 107 may be under gate structures 110 and some portions of fin isolation structure 107 may be under ESL 122 and ILD layer 124, as shown in FIG. 2C. In some embodiments, S/D contact structures 128 may not be formed on fin isolation structures 107 and may be formed on epitaxial regions 108. FIG. 2C shows vertical dimension 107$t$ may be substantially equal to vertical dimension 106A$t$.

Figure 3A:
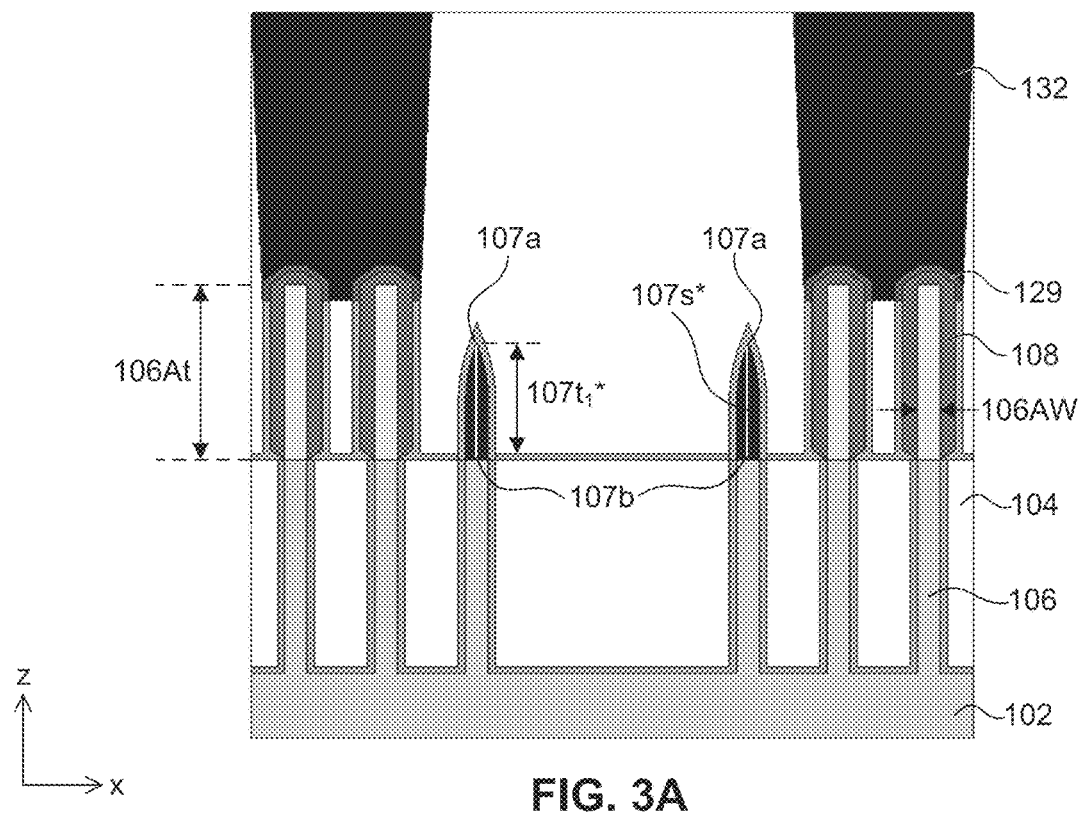
FIGS. 3A-3C are cross-sectional views of finFETs, in accordance with some embodiments.
Figure 3B:
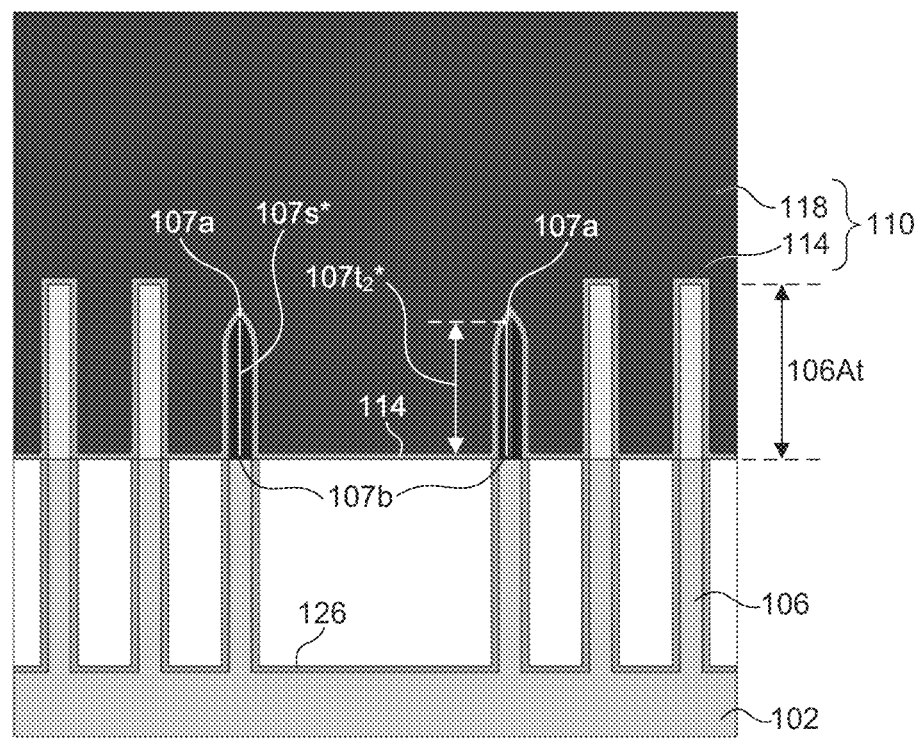
Figure 3C:
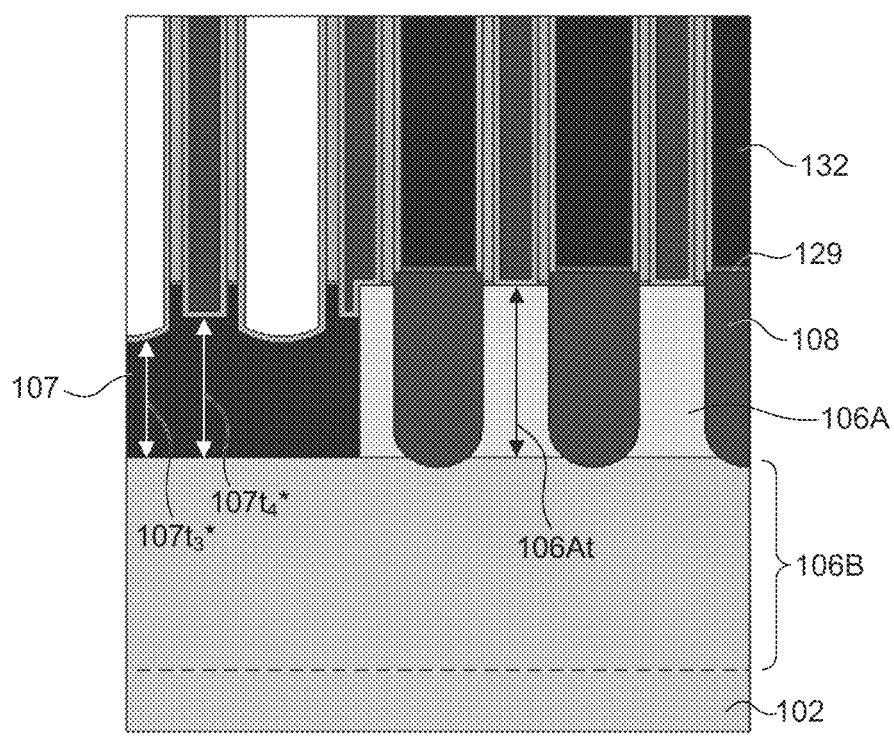

FinFETs 100A and 100B are further described with reference to FIGS. 3A-3C. Elements in FIGS. 3A-3C with the same annotations as elements in FIGS. 1 and 2A-2B are described above. The discussion of elements of FIGS. 1 and 2A-2B applies to elements of FIGS. 3A-3C unless mentioned otherwise. FIGS. 3A-3C are cross-sectional views along lines A-A, B-B, and C-C of device 100 of FIG. 1, respectively, according to some embodiments. It will be recognized that the views of finFETs 100A and 100B in FIGS. 3A-3C are shown for illustration purposes and may not be drawn to scale. It will be recognized that cross-sectional shapes of STI regions 104, fin structures 106, fin isolation structures 107, epitaxial regions 108, gate structures 110, spacers 120, ESL 122, ILD layer 124, and S/D contact structures 128 shown in FIGS. 3A-3C are illustrative and are not intended to be limiting.

As shown in FIGS. 3A-3B, some portions of fin isolation structures 107 may be wrapped around with ESL 122 and ILD layer 124 and some portions may be wrapped around with oxide layer 114 and gate electrode 118, respectively. In some embodiments, cross-sections of fin isolation structures 107 under ILD layer 124 may each have a vertical dimension 107$t_1$* that is smaller than vertical dimensions 106A$t$ of fin portions 106A, as shown in FIG. 3A. In some embodiments, dimension 107$t_1$* may range from about 40 nm to about 50 nm. In some embodiments, cross-sections of fin isolation structures 107 under gate structures 110 may each have a vertical dimension 107$t_2$* that is smaller than vertical dimensions 106A$t$ of fin portions 106A, as shown in FIG. 3B. In some embodiments, dimension 107$t_2$* may range from about 40 nm to about 50 nm. In some embodiments, dimensions 107$t_1$* and 107$t_2$* may be equal to or different from each other.

In some embodiments, the cross-sections of fin isolation structures 107 under ILD layer 124 and gate structures 110 may each have a horizontal dimension that varies along a Z-axis. For example, as shown in FIGS. 3A-3B, horizontal dimensions of fin isolation structures 107 under ILD layer 124 and gate structure 110 gradually becomes smaller from bases 107$b$ towards peaks 107$a$ of fin isolation structures 107. In some embodiments, horizontal dimension at bases 107$b$ of fin isolation structures may be substantially equal to horizontal dimensions 106Aw of fin portions 106A.

FIG. 3C shows a cross-sectional view of device 100 along line C-C running through one of fin structures 106 having a fin isolation structure 107, according to some embodiments. As shown in FIG. 3C, fin isolation structure 107 may be adjacent to fin portion 106A along a Y-axis and may be on top of fin portion 106B. Further shown in FIG. 3C, a cross-section of fin isolation structure 107 along a Y-axis may have varying vertical dimensions. For example, the cross-section of fin isolation structure 107 along a Y-axis may have a first vertical dimension 107$t_3$* under ILD layer 124 and may have a second vertical dimension 107$t_4$* that may be different from 107$t_3$*. In some embodiments, vertical dimensions 107$t_1$*, 107$t_2$*, 107$t_3$*, and 107$t_4$* may be equal to or different from each other and may be smaller than dimensions 106A$t$ of fin portions 106A.

Figure 4:
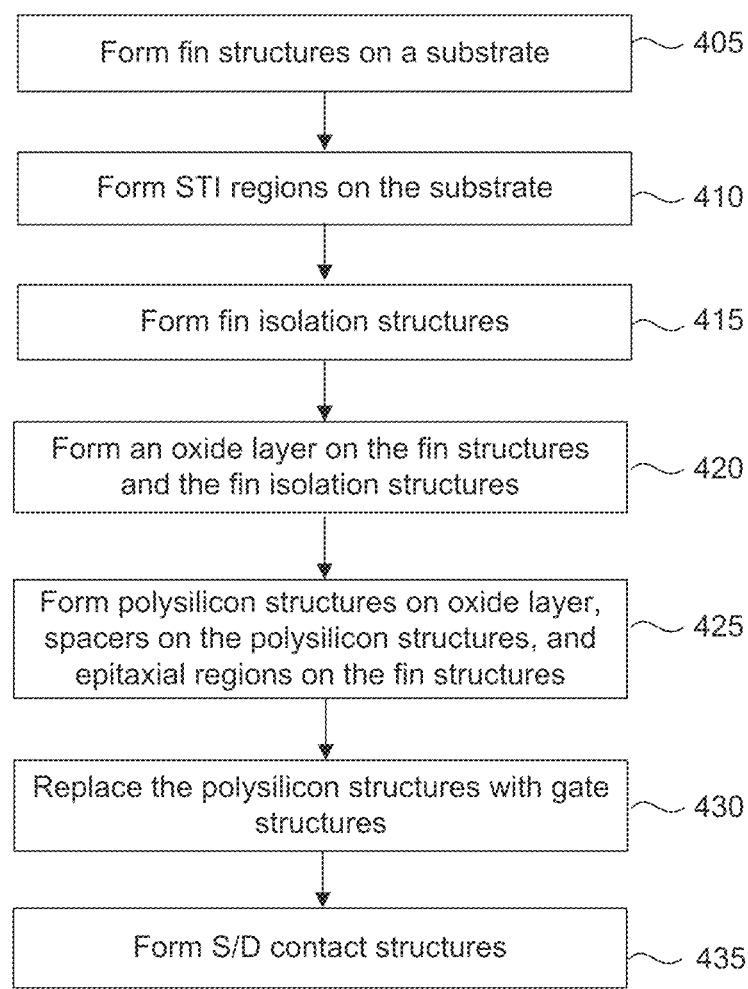
FIG. 4 is a flow diagram of a method for fabricating finFETs, in accordance with some embodiments.

FIG. 4 is a flow diagram of an example method 400 for fabricating device 100 as described with reference to FIGS. 1, 2A-2B, and 3A-3B, according to some embodiments. For illustrative purposes, the operations illustrated in FIG. 4 will be described with reference to the example fabrication process for fabricating device 100 as illustrated in FIGS. 5-14. FIGS. 5-14 are isometric views of device 100 at various stages of its fabrication, according to some embodiments. Operations can be performed in a different order or not performed depending on specific applications. It should be noted that method 400 does not produce complete device 100. Accordingly, it is understood that additional processes may be provided before, during, and after method 400, and that some other processes may only be briefly described herein. Elements in FIGS. 5-11 with the same annotations as elements in FIGS. 1, 2A-2C, and 3A-3C are described above.

Figure 5:
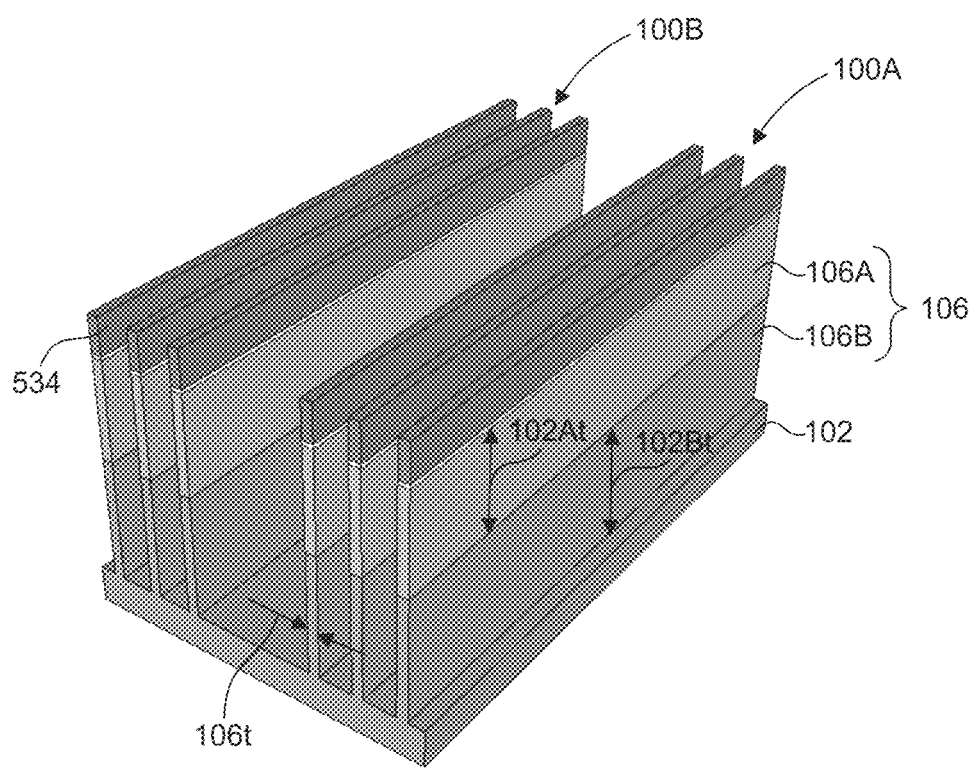
FIGS. 5-14 are isometric views of finFETs at various stages of their fabrication process, in accordance with some embodiments.
Figure 6:
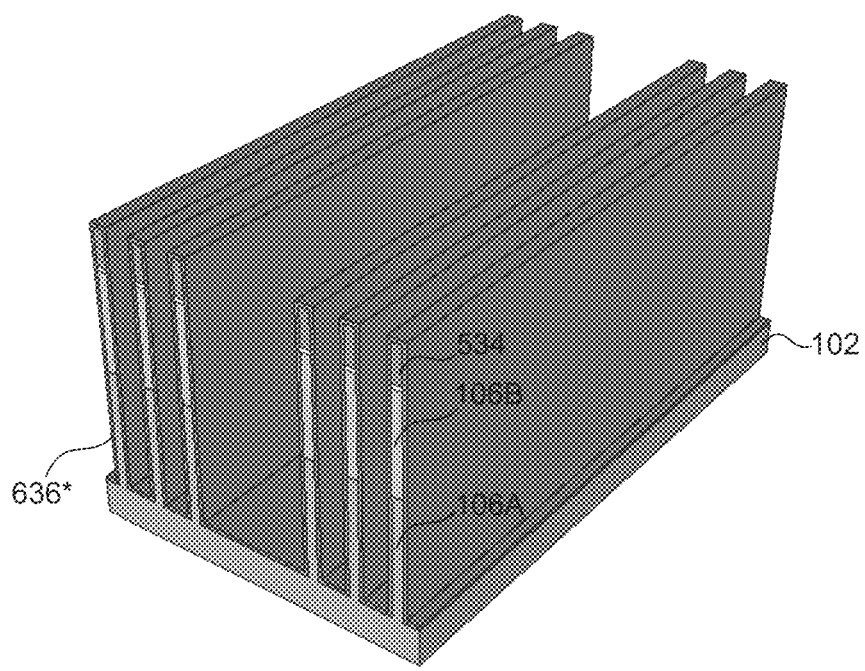
Figure 7:
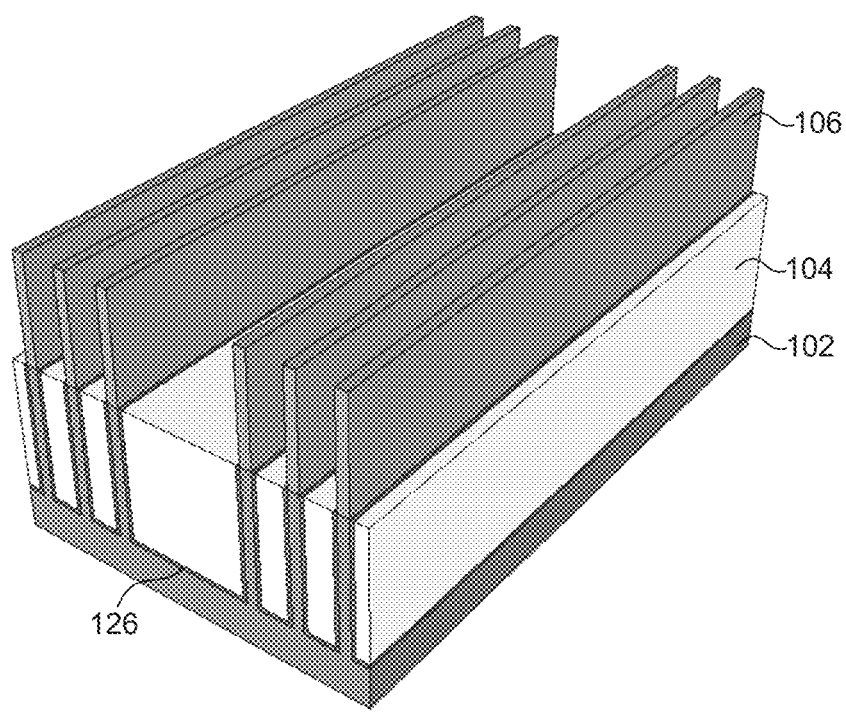
Figure 8:
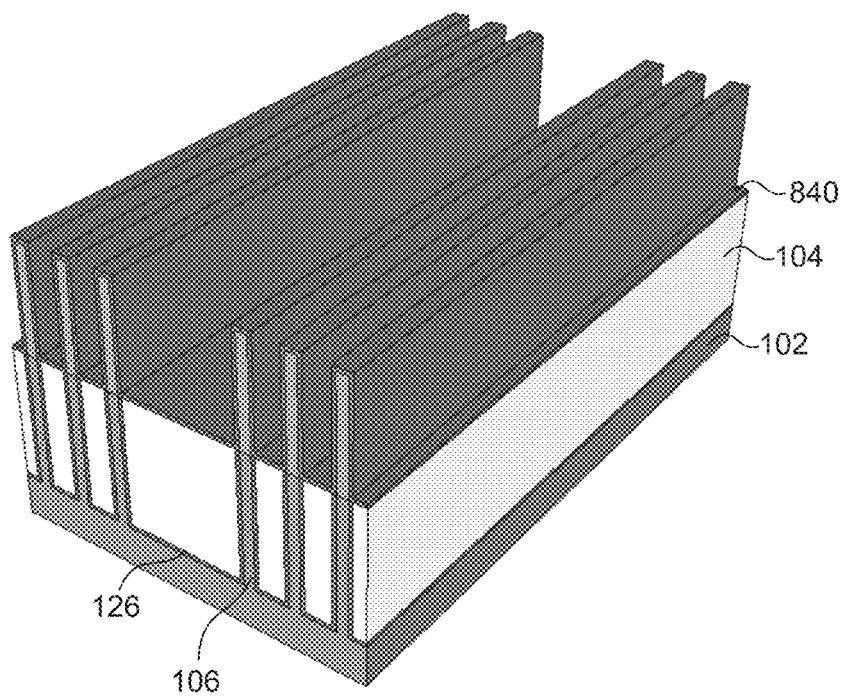

In operation 405, fin structures of first and second finFETs are formed on a substrate. For example, as shown in FIG. 5, fin structures 106 of finFETs 100A and 100B are formed on substrate 102. The formation of fin structures 106 may include (i) epitaxially growing a layer of SiGe on unetched substrate 102, (ii) patterning a hard mask layer on the epitaxial layer of SiGe to form a patterned hard mask layer 534, and (iii) etching the epitaxial layer of SiGe and substrate 102 through patterned hard mask layer 534. The etching may be performed using, for example, a dry etch process, a wet etch process, or a combination thereof. The dry etch process may use reactive ion etching using a chlorine or fluorine based etchant. In some embodiments, the hard mask layer may be a thin film including silicon oxide formed, for example, using a thermal oxidation process. In some embodiments, hard mask layer may be formed of silicon nitride using, for example, low pressure chemical vapor deposition (LPCVD) or plasma enhanced CVD (PECVD). In some embodiments, fin portions 106A having SiGe may have a vertical dimension ranging from about 50 nm to about 60 nm and fin portions 106B may have a vertical dimension ranging from about 50 nm to about 60 nm. In some embodiments, fin structures 106 may have a horizontal dimension ranging from about 5 nm to about 10 nm.

In referring to FIG. 4, in operation 410, STI regions are formed on the substrate. For example, STI regions 104 may be formed as described with reference to FIGS. 6-7. The formation of STI regions 104 may include depositing a protective layer 636* (shown in FIG. 6) on the structure of FIG. 5 to form the structure shown in FIG. 6, depositing a layer of insulating material for STI regions 104 on protective layer 636, annealing of the layer of insulating material, chemical mechanical polishing (CMP) the annealed layer of insulating material, and etching the polished structure to form the structure of FIG. 7. The protective layer 636 may include a nitride material (e.g., SiN) and may be deposited using, for example, ALD or CVD. Protective layer 636 may help to prevent oxidation of fin structures 106 during the annealing process of the layer of insulating material.

In some embodiments, the layer of insulating material may include, for example, silicon oxide, silicon nitride, silicon oxynitride, fluoride-doped silicate glass (FSG), or a low-k dielectric material. In some embodiments, the deposition of the layer of insulating material may be performed using any deposition methods suitable for flowable dielectric materials (e.g., flowable silicon oxide). For example, flowable silicon oxide may be deposited for STI regions 104 using a flowable CVD (FCVD) process. The FCVD process may be followed by a wet anneal process. The wet anneal process may include annealing the deposited layer of insulating material in steam at a temperature in a range from about 200° C. to about 700° C. for a period in a range from about 30 min to about 120 min. The wet anneal process may be followed by the CMP process that may remove the patterned hard mask layer and portions of the layer of the insulating material to substantially coplanarize a top surface of the layer of insulating material with top surfaces of fin structures 106. The CMP process may be followed by the etching process to etch back the layer of insulating material and protective layer 636 to form the structure of FIG. 7.

The etch back of the layer of insulating material may be performed, for example, by a dry etch process, a wet etch process, or a combination thereof. In some embodiments, the dry etch process may include using a plasma dry etch with a gas mixture having octafluorocyclobutane ($C_4F_8$), argon (Ar), oxygen ($O_2$), and helium (He), fluoroform ($CHF_3$) and He, carbon tetrafluoride ($CF_4$), difluoromethane ($CH_2F_2$), chlorine ($Cl_2$), and $O_2$, hydrogen bromide (HBr), $O_2$, and He, or a combination thereof with a pressure ranging from about 1 mTorr to about 5 mTorr. In some embodiments, the wet etch process may include using a diluted hydrofluoric acid (DHF) treatment, an ammonium peroxide mixture (APM), a sulfuric peroxide mixture (SPM), hot deionized water (DI water), or a combination thereof. In some embodiments, the wet etch process may include using a CERTAS® etch process that may use ammonia ($NH_3$) and hydrofluoric acid (HF) as etchants and inert gases such as, for example, Ar, xenon (Xe), He, or a combination thereof. In some embodiments, the flow rate of HF and $NH_3$ used in the CERTAS® etch process may each range from about 10 sccm to about 100 sccm (e.g., about 20 sccm, 30 sccm, or 40 sccm). In some embodiments, the CERTAS® etch process may be performed at a pressure ranging from about 5 mTorr to about 100 mTorr (e.g., about 20 mTorr, about 30 mTorr, or about 40 mTorr) and a high temperature ranging from about 50° C. to about 120° C.

Figure 10:
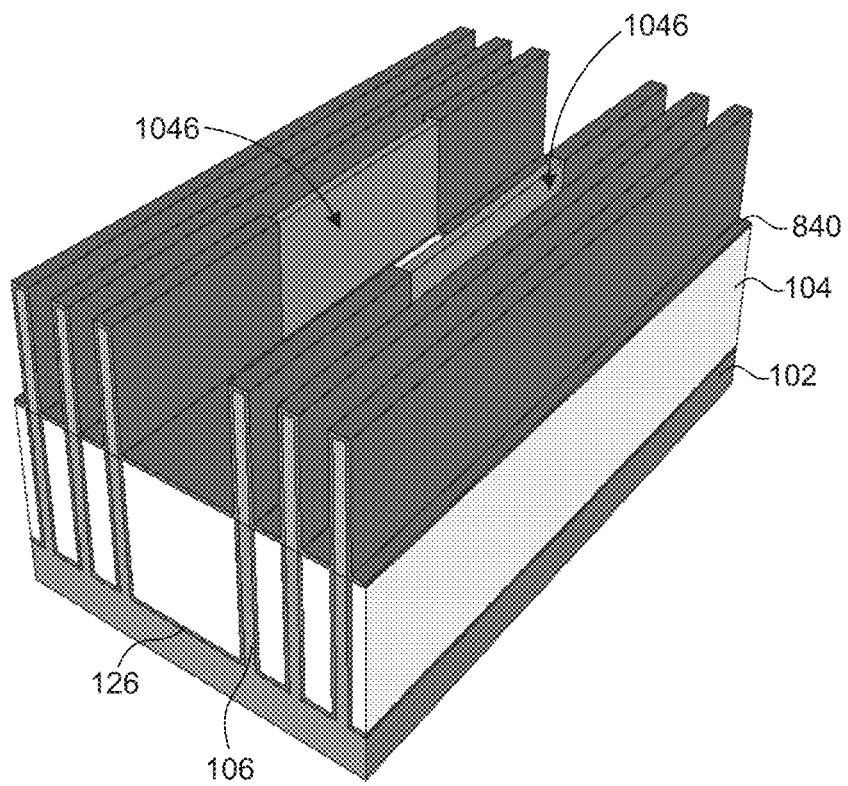
Figure 11:
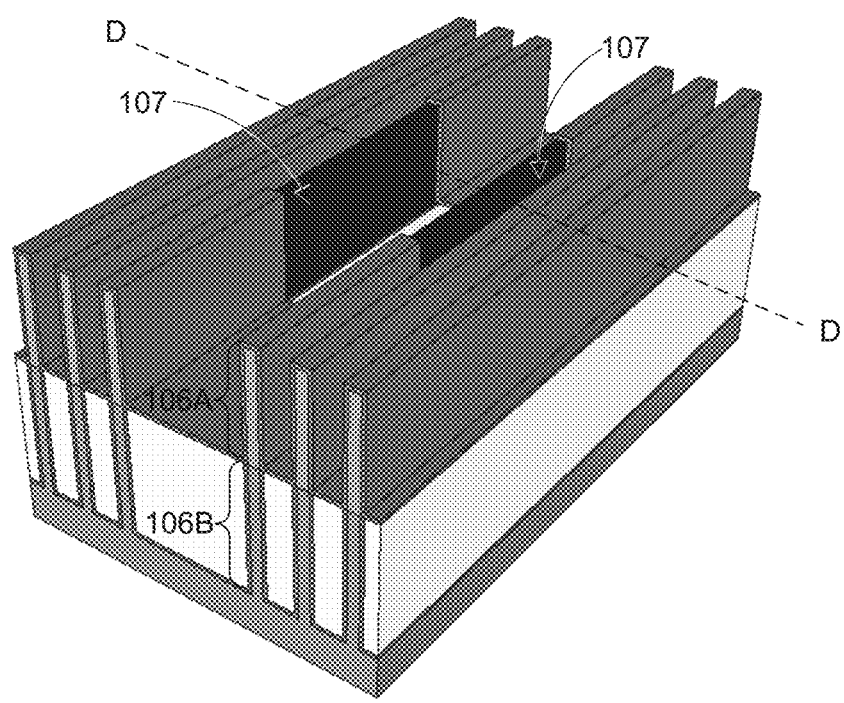

In referring to FIG. 4, in operation 415, fin isolation structures are formed on portions of the fin structures. For example, fin isolation structures 107 (as shown in FIG. 11) may be formed on fin portions 106B of fin structures 106 as described with reference to FIGS. 8-11. The formation of fin isolation structures 107 may include selectively modifying (e.g., converting and/or oxidizing) one or more portions of fin structures 106. In some embodiments, the formation of fin isolation structures 107 may include selectively modifying (e.g., converting and/or oxidizing) one or more fin portions 106A of fin structures 106. The selective modification (e.g., conversion and/or oxidization) process may include depositing a masking layer 840 (shown in FIG. 8) on the structure of FIG. 7, patterning the structure of FIG. 8 to form an exposed region 944 (shown in FIG. 9), etching exposed portions of masking layer 840 through exposed region 942 to form etched fin portions 1046 (shown in FIG. 10), and oxidizing the etched fin portions 1046 to form fin isolation structure 107 (shown in FIG. 11).

Figure 9:
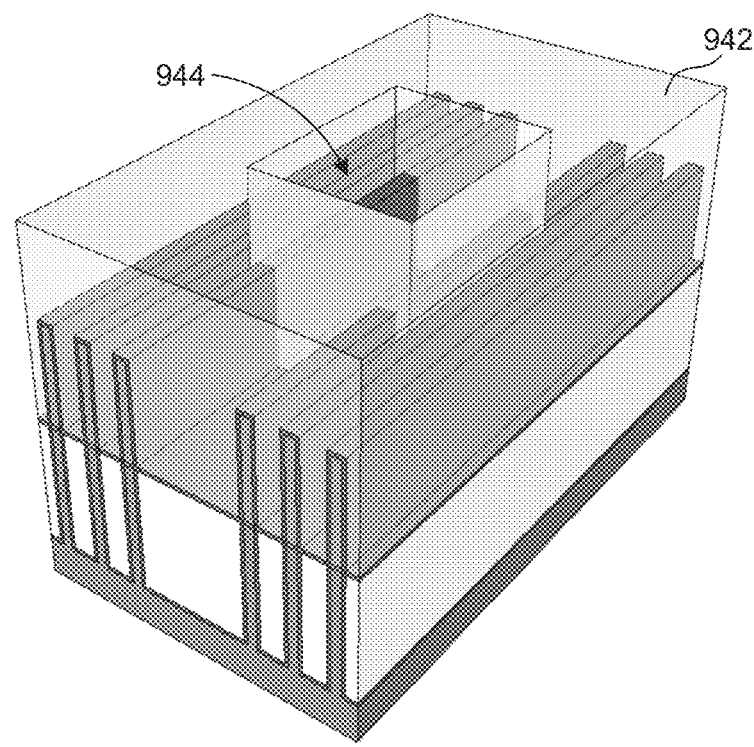

In some embodiments, masking layer 840 may include nitride material (e.g., SiN) and may be deposited using, for example, ALD or CVD. Masking layer 840 may have a thickness ranging from about 2 nm to about 4 nm. As shown in FIG. 9, a portion of masking layer 840 may be exposed through an exposed region 944 that may be formed using a patterned photoresist layer 942. The formation of patterned photoresist 942 may be followed by the etching process to remove portion of masking layer 840 on fin structures 106A that are exposed through exposed region 944. The etching process may form etched fin portions 1046 as shown in FIG. 10. The etching process may be a dry etching process (e.g., reaction ion etching), a wet etching process, or a combination thereof. The etching process may be followed by the oxidation process to substantially modify (e.g., convert and/or oxidize) the material (e.g., SiGe) of the etched fin portions 1046 into an oxide material (e.g., $SiO_2$ or Ge-doped $SiO_2$) to form fin isolation structures 107 as shown in FIG. 11.

The oxidation process may include flowing steam on the structure of FIG. 10 in a chamber at a temperature ranging from about 400° C. to about 500° C. During the oxidation process, etched fin portions 1046 may be modified (e.g., converted and/or oxidized) to the oxide material from their outer surfaces towards their center until substantially all portions of etched fin portions 1046 may be modified (e.g., converted and/or oxidized) to the oxide material of fin isolation structures 107.

Figure 12:
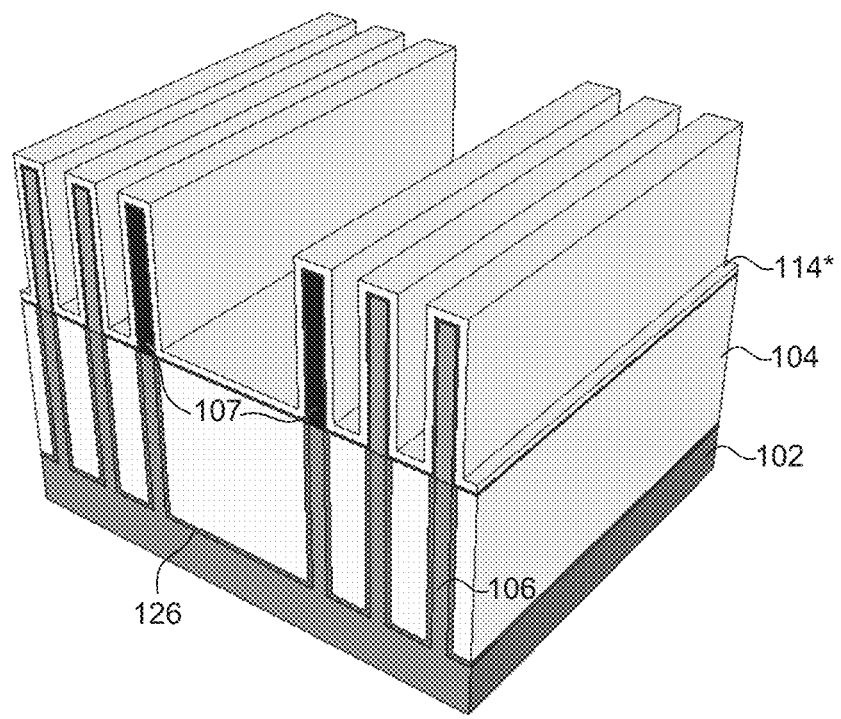

In referring to FIG. 4, in operation 420, an oxide layer are formed on the fin structures and the fin isolation structures. For example, a layer of oxide material may be blanket deposited on the structure of FIG. 11 followed by a high temperature anneal process to form oxide layer 114\* as shown in FIG. 12. FIG. 12 is an isometric cut view of the structure of FIG. 11 along line D-D after the deposition of layer of oxide material. The layer of oxide material may include, for example, silicon oxide and may be formed by CVD, atomic layer deposition (ALD), plasma enhanced ALD (PEALD), physical vapor deposition (PVD), e-beam evaporation, or other suitable process. In some embodiments, the layer of oxide material may be deposited using PEALD at an energy ranging from about 400 W to about 500 W and at a temperature ranging from about 300° C. to about 500° C. The deposition of the layer of oxide material may be followed by a high temperature anneal process. In some embodiments, the structure of FIG. 12 after the deposition of the layer of oxide material may be subjected to a dry anneal process under oxygen gas flow at a temperature ranging from about 800° C. to about 1050° C.

Figure 13:
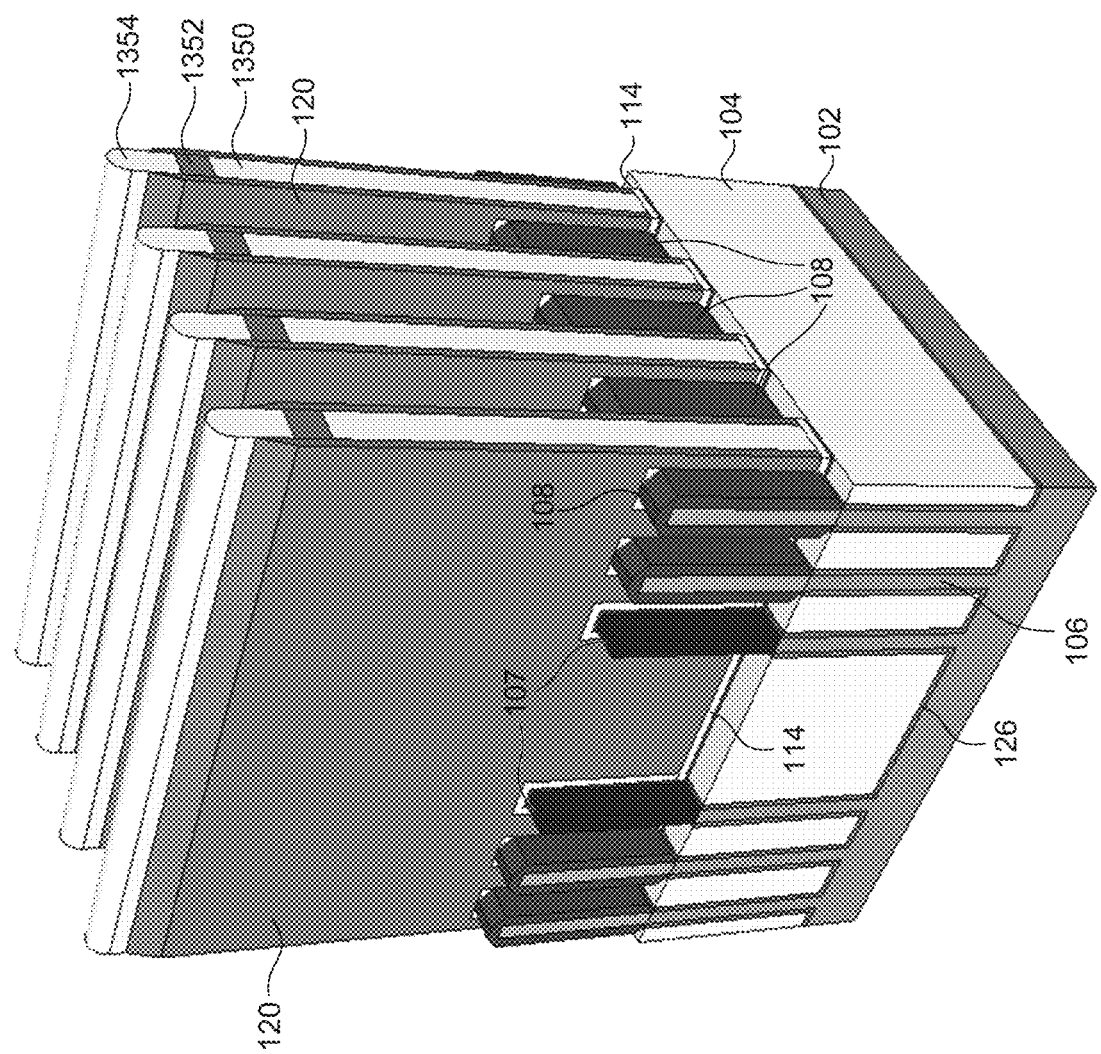

In referring to FIG. 4, in operation 425, a polysilicon structure and epitaxial regions are formed on the fin structures and spacers are formed on sidewalls of the polysilicon structures. For example, polysilicon structure 1350, spacers 120, and epitaxial regions 108 may be formed as shown in FIG. 13. Polysilicon structure 1350 may be formed on the structure of FIG. 12. In some embodiments, a vertical dimension of polysilicon structure 1350 may be in a range from about 90 nm to about 200 nm. In some embodiments, polysilicon structure 1350 and hard mask layers 1352 and 1354 may be replaced in a gate replacement process during subsequent processing to form gate structures 110 discussed above.

In some embodiments, polysilicon structure 1350 may be formed by blanket deposition of polysilicon, followed by photolithography and etching of the deposited polysilicon. The deposition process may include chemical vapor deposition (CVD), physical vapor deposition (PVD), atomic layer deposition (ALD), other suitable deposition methods, or a combination thereof. Photolithography may include photoresist coating (e.g., spin-on coating), soft baking, mask aligning, exposure, post-exposure baking, developing the photoresist, rinsing, drying (e.g., hard baking), other suitable processes, or a combination thereof. Etching processes may include dry etching, wet etching, and/or other etching methods (e.g., reactive ion etching).

In some embodiments, hard mask layers 1352 and 1354 may be patterned on polysilicon structure 1350 to protect polysilicon structure 1350 from subsequent processing steps. Hard mask layers 1352 and 1354 may include insulating material such as, for example, silicon nitride.

The formation of hard mask layers 1352 and 1354 may be followed by formation of spacers 120 on sidewalls of polysilicon structure 1350. Spacers 120 may be selectively formed on sidewalls of polysilicon structure 1350 and may not be formed on oxide layer 114* (shown in FIG. 12). The selective formation of spacers 120 may include a surface treatment and a deposition process. The surface treatment may include exposing oxide layer 114* and polysilicon structure 1350 to an inhibitor to form an inhibiting layer (not shown) on top surface of oxide layer 114* and to form a H- or F-terminated surfaces on the sidewalls of polysilicon structure 1350. The inhibiting layer may have a hydroxyl-terminated surface. The H- or F-terminated surfaces may facilitate the deposition of the material of spacers 120. The surface treatment may further include selectively converting the hydroxyl-terminated surface to a hydrophobic surface by including a hydrophobic component (e.g., a component having carbon) to the hydroxyl-terminated surface. The hydrophobic surface may prevent deposition of the material of spacers 120 on oxide layer 114*. The surface treatment may be followed by the deposition of the material of spacer 120.

In some embodiments, the material of spacers 120 may be deposited using, for example, CVD or ALD. The surface treatment may be performed before or during the deposition process. The deposition process may be followed by, for example, an oxygen plasma treatment to remove the hydrophobic component and the inhibitor layer on the top surface of oxide layer 114*. In some embodiments, spacer 120 may include (i) a dielectric material such as, for example, silicon oxide, silicon carbide, silicon nitride, silicon oxy-nitride, (ii) an oxide material, (iii) an nitride material, (iv) a low-k material, or (v) a combination thereof. In some embodiments, oxide layer 114* may include silicon oxide and spacers 120 may include silicon nitride.

The selective formation of spacers 120 may followed by formation of oxide layer 114 (shown in FIG. 13) by etching of oxide layer 114* from regions that are not covered by polysilicon structure 1350 and spacers 120. The etch process may include a wet etch process using, for example, diluted HF.

The etching of oxide layer 114* may be followed by the growth of epitaxial regions 108 on fin structures 106. In some embodiments, epitaxial regions 108 may be grown by (i) chemical vapor deposition (CVD) such as, for example, by low pressure CVD (LPCVD), atomic layer CVD (AL-CVD), ultrahigh vacuum CVD (UHVCVD), reduced pressure CVD (RPCVD), or any suitable CVD; (ii) molecular beam epitaxy (MBE) processes; (iii) any suitable epitaxial process; or (iv) a combination thereof. In some embodiments, epitaxial regions 108 may be grown by an epitaxial deposition/partial etch process, which repeats the epitaxial deposition/partial etch process at least once. As discussed above, such repeated deposition/partial etch process is also called a "cyclic deposition-etch (CDE) process." In some embodiments, epitaxial regions 108 may be grown by selective epitaxial growth (SEG), where an etching gas is added to promote the selective growth of semiconductor material on the exposed surfaces of fin structures 106, but not on insulating material (e.g., dielectric material of STI regions 104).

In some embodiments, epitaxial regions 108 may be p-type or n-type. In some embodiments, epitaxial regions 108 may be of opposite doping type with respect to each other. In some embodiments, p-type epitaxial regions 108 may include SiGe and may be in-situ doped during an epitaxial growth process using p-type dopants such as, for example, boron, indium, or gallium. For p-type in-situ doping, p-type doping precursors such as, but not limited to, diborane (B2H6), boron trifluoride (BF3), and/or other p-type doping precursors can be used. In some embodiments, n-type epitaxial regions 108 may include Si and may be in-situ doped during an epitaxial growth process using n-type dopants such as, for example, phosphorus or arsenic. For n-type in-situ doping, n-type doping precursors such as, but not limited to, phosphine ($PH_3$), arsine ($AsH_3$), and/or other n-type doping precursor can be used.

Figure 14:
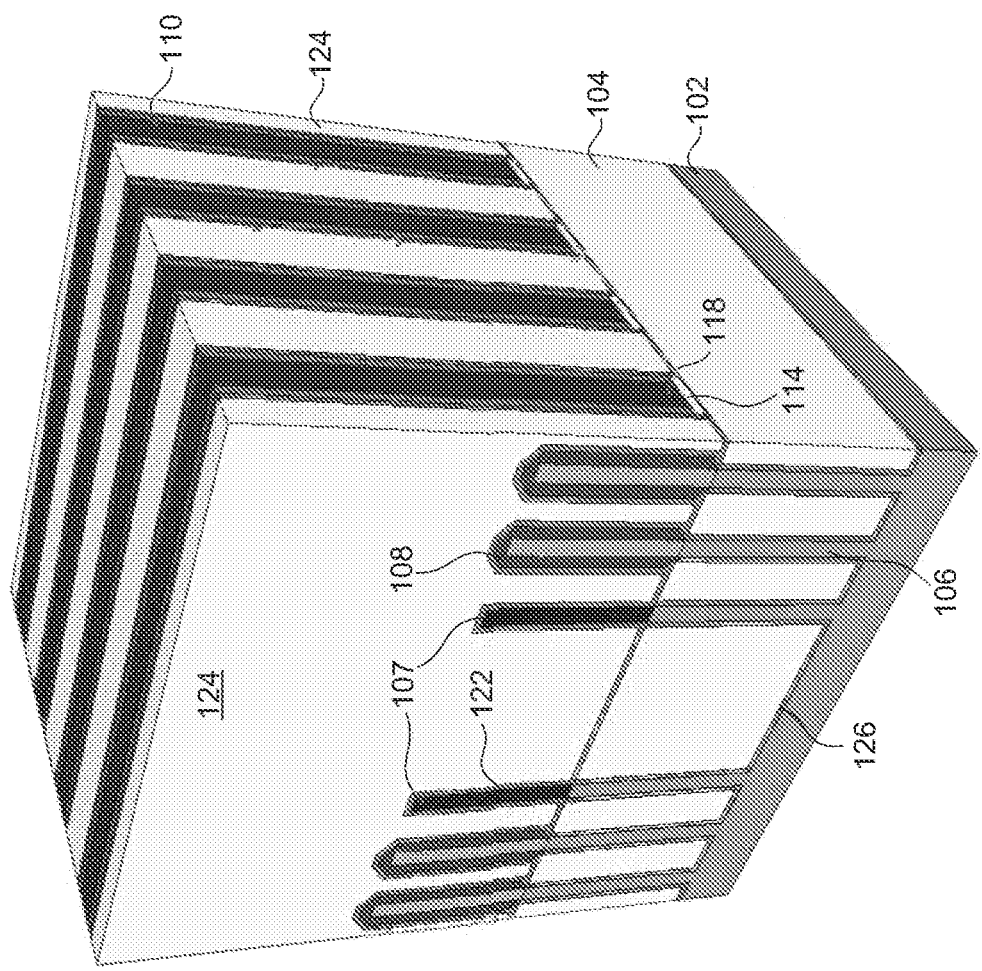

In referring to FIG. 4, in operation 435, the polysilicon structure is replaced with a gate structure. For example, as shown in FIG. 14, gate structures 110 may be formed after removing polysilicon structures 1350. In some embodiments, prior to the removal of polysilicon structures 1350, ESL 122 and ILD layer 124 may be formed as shown in FIG. 14. In some embodiments, ESL 122 may include, for example, $SiN_x$, SiON, SiC, SiCN, BN, SiBN, SiCBN, or a combination thereof. In some embodiments, ESL 122 may include silicon nitride formed by low pressure chemical vapor deposition (LPCVD), plasma enhanced chemical vapor deposition (PECVD), chemical vapor deposition (CVD), or atomic layer deposition (ALD). In some embodiments, ILD layer 124 may include a dielectric material. The dielectric material of ILD layer 124 may be deposited using a deposition method suitable for flowable dielectric materials (e.g., flowable silicon oxide). For example, flowable silicon oxide may be deposited for ILD layer 124 using flowable CVD (FCVD).

The removal of polysilicon structure 1350 and hard mask layers 1352 and 1354 may be performed using a dry etching process (e.g., reaction ion etching) or a wet etching process. In some embodiments, the gas etchants used in etching of polysilicon structure 1350 and hard mask layers 1352 and 1354 may include chlorine, fluorine, or bromine. In some embodiments, an $NH_4OH$ wet etch may be used to remove polysilicon structure 1350, or a dry etch followed by a wet etch process may be used to remove polysilicon structure 1350.

The formation of gate structures 110 may include deposition of dielectric layer (not shown). Dielectric layer may include silicon oxide and may be formed by CVD, atomic layer deposition (ALD), physical vapor deposition (PVD), e-beam evaporation, or other suitable process. In some embodiments, dielectric layer 122 may include (i) a layer of silicon oxide, silicon nitride, and/or silicon oxynitride, (ii) a high-k dielectric material such as, for example, hafnium oxide ($HfO_2$), $TiO_2$, HfZrO, $Ta_2O_3$, $HfSiO_4$, $ZrO_2$, $ZrSiO_2$, (iii) a high-k dielectric material having oxides of Li, Be, Mg, Ca, Sr, Sc, Y, Zr, Al, La, Ce, Pr, Nd, Sm, Eu, Gd, Tb, Dy, Ho, Er, Tm, Yb, or Lu, or (iv) a combination thereof. High-k dielectric layers may be formed by ALD and/or other suitable methods. In some embodiments, dielectric layer 122 may include a single layer or a stack of insulating material layers.

The deposition of dielectric layer may be followed by deposition of gate electrode 118. Gate electrode 118 may include a single metal layer or a stack of metal layers. The stack of metal layers may include metals different from each other. In some embodiments, gate electrode 118 may include a suitable conductive material such as, for example, Ti, Ag, Al, TiAlN, TaC, TaCN, TaSiN, Mn, Zr, TiN, TaN, Ru, Mo, WN, Cu, W, Co, Ni, TiC, TiAlC, TaAlC, metal alloys, and/or combinations thereof. Gate electrode 124 may be formed by ALD, PVD, CVD, or other suitable deposition process.

The deposited dielectric layer and gate electrode 118 may be planarized by a CMP process. The CMP process may coplanarize top surfaces of dielectric layer and gate electrode 118 with top surface ILD layer 124 as shown in FIGS. 11A and 11B.

In referring to FIG. 4, in operation 440, S/D contact structures are formed in S/D contact openings. For example, S/D contact structures 128 may be formed in S/D contact openings (not shown) as shown in FIG. 1. The formation of S/D contact structures 128 may include formation of S/D contact openings, formation of metal silicide layers 129 and conductive regions 132 to form the structure as shown in FIG. 1.

S/D contact openings (not shown) may be formed on epitaxial regions 108. The formation of S/D contact openings may include (i) removing portions of ILD layer 124 overlying epitaxial S/D regions 108 to form etched ILD layer and (ii) removing portions of ESL 122 underlying the etched portions of ILD layer 124. The removal of the portions of ILD layer 124 may include patterning using photolithography to expose areas on top surface of ILD layer 124 corresponding to the portions of ILD layer 124 that are to be removed. The portions of ILD layer 124 may be removed by a dry etching process. In some embodiments, the dry etching process may be a fluorine-based process.

The ILD etch process may include two steps. In the first etch step, etching may be performed using $CF_4$ gas at a flow rate ranging from about 50 sccm to about 500 sccm. In the second etch step, etching may be performed using a gas mixture including $C_4F_6$ gas at a flow rate ranging from about 5 sccm to about 50 sccm, Ar gas at a flow rate ranging from about 100 sccm to about 500 sccm, and $O_2$ gas at a flow rate ranging from about 5 sccm to about 50 sccm. In some embodiments, each of the first and second etch steps may be carried out for a time period ranging from about 1 sec to about 60 sec. In some embodiments, each of the first and second etch steps may be performed at a temperature ranging from about 10° C. to about 100° C., under a pressure ranging from about 3 mTorr to about 500 mTorr, and at an RF power ranging from about 300 W to about 800 W. In some embodiments, the first etch step has a higher etch rate than the second etch step.

The etching of the portions of ILD layer 124 may be followed by a dry etching of portions of ESL 122 underlying the etched portions of ILD layer 124. In some embodiments, these portions of ESL 122 may be etched in two steps. In the first etch step, etching may be performed using a gas mixture including difluoromethane ($CH_2F_2$) gas at a flow rate ranging from about 5 sccm to about 50 sccm and carbon tetrafluoride ($CF_4$) gas at a flow rate ranging from about 10 sccm to about 100 sccm. In the second etch step, etching may be performed using a gas mixture including fluoromethane ($CH_3F$) gas at a flow rate ranging from about 5 sccm to about 50 sccm, Ar gas at a flow rate ranging from about 100 sccm to about 500 sccm, and $H_2$ gas at a flow rate ranging from about 100 sccm to about 500 sccm. In some embodiments, each of the first and second etch steps may be carried out for a time period ranging from about 1 sec to about 60 sec. In some embodiments, each of the first and second etch steps may be performed at a temperature ranging from about 10° C. to about 100° C., under a pressure ranging from about 10 mTorr to about 100 mTorr, and at an RF power ranging from about 500 W to about 800 W. In some embodiments, the first etch step has a higher etch rate than the second etch step.

In some embodiments, the formation of S/D contact openings may be followed by formation of metal silicide layers 129 as shown in FIG. 1. In some embodiments, the metal used for forming metal silicides may include Co, Ti, or Ni. The formation of metal silicide layers 129 may be followed by formation of conductive regions 132. The formation of conductive regions 132 may include deposition of materials of conductive regions 132 in S/D contact openings to form the structure as shown in FIG. 1. Blanket deposition of the materials of conductive regions 132 may be performed using, for example, PVD, CVD, or ALD. In some embodiments, conductive regions 132 may include a conductive material such as, for example, W, Al, Co, Cu, or a suitable conductive material.

The deposition of the materials of conductive regions 132 may be followed by a CMP process to coplanarize top surfaces of conductive regions 132 with top surface of ILD layer 124. In some embodiments, the CMP process, may use a silicon or an aluminum abrasive with abrasive concentrations ranging from about 0.1% to about 3%. In some embodiments, the silicon or aluminum abrasive may have a pH level less than 7 for W metal in conductive regions 132 or may have a pH level greater than 7 for cobalt (Co) or copper (Cu) metals in conductive regions 132.

The above embodiments describe structures and methods for fabricating fin isolation structures (e.g., fin isolation structures 107) of finFETs (e.g., finFETs 100A and 100B) with fewer process steps than other methods used in forming fin isolation structures. The example methods may form the fin isolation structures without substantially degrading the structural integrity of fin structures (e.g., fin portions 106A and 106B) adjacent to and/or in contact with the fin isolation structures. In some embodiments, the example methods may form the fin isolation structures without substantially reducing strain in the fin structures and without adversely affecting the high mobility channel performance of the finFETs.

In some embodiments, a method of forming a fin field effect transistor (finFET) on a substrate includes forming a fin structure on the substrate and forming a shallow trench isolation (STI) region on the substrate. First and second fin portions of the fin structure extend above a top surface of the STI region. The method further includes oxidizing the first fin portion to convert a first material of the first fin portion to a second material. The second material is different from the first material of the first fin portion and a material of the second fin portion. The method further includes forming an oxide layer on the oxidized first fin portion and the second fin portion and forming first and second polysilicon structures on the oxide layer.

In some embodiments, a method of forming a fin field effect transistor (finFET) on a substrate includes forming a fin structure on the substrate and oxidizing a fin portion of the fin structure to convert a material of the fin portion to an oxide material that is different from a material of other fin portions of the fin structure. The method further includes forming an oxide layer on the oxidized fin portion and the other fin portions, forming a polysilicon structure on the oxide layer and replacing the polysilicon structure with a gate structure.

In some embodiments, a fin field effect transistor (finFET) on a substrate includes a fin structure on the substrate. The fin structure having first and second fin portions adjacent to each other. The first fin portion having a material that is different from an oxide material of the second fin portion. The finFET further includes an epitaxial region on the first fin portion an etch stop layer on the epitaxial region and on the second fin portion. The finFET further includes first and second gate structures on the first and second fin portions, respectively and a source/drain contact structure on the epitaxial region.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a first fin comprising upper and lower first fin portions, wherein the upper first fin portion comprises a first material;
an epitaxial region on the upper first fin portion;
a second fin adjacent to the first fin and comprising upper and lower second fin portions, wherein the upper second fin portion comprises:
a first portion comprising the first material and in contact with the lower second fin portion; and
a second portion comprising a second material different from the first material, wherein the second portion is in contact with the lower second fin portion;
an etch stop layer on the epitaxial region and on the upper second fin portion; and
a gate structure formed on the upper first fin portion and the upper second fin portion.

2. The semiconductor structure of claim 1, further comprising a shallow trench isolation (STI) region having a top surface.

3. The semiconductor structure of claim 2, wherein the upper first and second fin portions protrude from the top surface and the lower first and second fin portions are below the top surface.

4. The semiconductor structure of claim 1, wherein the upper first fin portion has a first vertical dimension and the upper second fin portion has a second vertical dimension less than the first vertical dimension.

5. The semiconductor structure of claim 1, further comprising an insulating layer on sidewalls of the lower first fin portion and the lower second fin portion.

6. The semiconductor structure of claim 1, wherein the upper first fin portion has a first vertical dimension and the upper second fin portion has a second vertical dimension that is substantially the same as the first vertical dimension.

7. The semiconductor structure of claim 6, wherein the first and second vertical dimensions are between about 50 nm and about 60 nm.

8. The semiconductor structure of claim 1, wherein the upper second fin portion has a horizontal dimension between about 5 nm and about 10 nm.

9. The semiconductor structure of claim 1, wherein the lower first and second fin portions comprise a same material.

10. A semiconductor structure, comprising:
a shallow trench isolation (STI) region;
a first fin, wherein an upper portion of the first fin protrudes from a top surface of the STI region and comprises a first vertical dimension; and
a second fin adjacent to the first fin, wherein the second fin comprises:
a first upper portion protruding from the top surface of the STI region and under an inter-layer dielectric (ILD) layer, wherein the first upper portion comprises a second vertical dimension; and
a second upper portion protruding from the top surface of the STI region and under a gate electrode, wherein the second upper portion comprises a third vertical dimension that is different from the second vertical dimension.

11. The semiconductor structure of claim 10, further comprising an epitaxial region on the upper portion of the first fin.

12. The semiconductor structure of claim 10, wherein the second vertical dimension is less than the third vertical dimension.

13. The semiconductor structure of claim 10, wherein the first and second fins comprise respective first and second lower portions below the top surface of the STI region, and wherein the first and second lower portions comprise a same material.

14. A semiconductor structure, comprising:
a shallow trench isolation (STI) region;
an inter-layer dielectric (ILD) layer over the STI region;
a gate electrode over the STI region; and
a fin, comprising:
a first upper portion protruding from a top surface of the STI region and under the ILD layer, wherein the first upper portion comprises a first vertical dimension; and
a second upper portion protruding from the top surface of the STI region and under the gate electrode, wherein the second upper portion comprises a second vertical dimension that is different from the first vertical dimension.

15. The semiconductor structure of claim 14, wherein the second vertical dimension is less than the first vertical dimension.

16. The semiconductor structure of claim 14, wherein the first and second upper portions comprise silicon oxide.

17. The semiconductor structure of claim 14, wherein the fin further comprises a lower portion below the top surface of the STI region and comprising silicon.

18. The semiconductor structure of claim 17, further comprising an insulating layer on sidewalls of the lower portion.

19. The semiconductor structure of claim 1, wherein the second fin comprises an interface with germanium dopants.

20. The semiconductor structure of claim 10, wherein the upper portion of the first fin and the first upper portion of the second fin comprise different materials from each other.

* * * * *